US012587206B2

(12) United States Patent
Yang et al.

(10) Patent No.: US 12,587,206 B2
(45) Date of Patent: Mar. 24, 2026

(54) ANALOG-TO-DIGITAL CONVERTER, SYSTEM-ON-CHIP AND ELECTRONIC CONTROL SYSTEM

(71) Applicant: GIGADEVICE SEMICONDUCTOR INC., Haidian (CN)

(72) Inventors: Qingqing Yang, Haidian (CN); Cong Wang, Haidian (CN)

(73) Assignee: GIGADEVICE SEMICONDUCTOR INC., Beijing (CN)

( * ) Notice: Subject to any disclaimer, the term of this patent is extended or adjusted under 35 U.S.C. 154(b) by 162 days.

(21) Appl. No.: 18/767,218

(22) Filed: Jul. 9, 2024

(65) Prior Publication Data

US 2025/0211248 A1 Jun. 26, 2025

(30) Foreign Application Priority Data

Dec. 25, 2023 (CN) .......................... 202311799519.6

(51) Int. Cl.
| | |
|---|---|
| *H03M 1/38* | (2006.01) |
| *G06F 3/05* | (2006.01) |
| *G06F 13/24* | (2006.01) |
| *G06F 15/78* | (2006.01) |
| *H03M 1/12* | (2006.01) |

(52) U.S. Cl.
CPC ................ *H03M 1/38* (2013.01); *G06F 3/05* (2013.01); *G06F 13/24* (2013.01); *G06F 15/7807* (2013.01); *H03M 1/1225* (2013.01); *H03M 1/123* (2013.01); *H03M 1/1245* (2013.01); *H03M 1/1285* (2013.01)

(58) Field of Classification Search
CPC ...... H03M 1/38; H03M 1/123; H03M 1/1285; H03M 1/1225; H03M 1/1245; G06F 13/24; G06F 3/05; G06F 15/7807

USPC .......................................... 341/141, 155, 161
See application file for complete search history.

(56) References Cited

U.S. PATENT DOCUMENTS

| | | | |
|---|---|---|---|
| 6,486,809 | B1 | 11/2002 | Figoli |
| 7,663,520 | B2 * | 2/2010 | Sugihara ................... H02P 6/18 |
| | | | 341/142 |
| 2023/0098382 | A1 * | 3/2023 | G ......................... H03M 1/1245 |
| | | | 341/141 |

OTHER PUBLICATIONS

Texas Instruments, DSP Controllers, TMS320LF2401A, Mar. 2001, 89 pages.

* cited by examiner

*Primary Examiner* — Khai M Nguyen
(74) *Attorney, Agent, or Firm* — Ziegler IP Law Group, LLC.

(57) ABSTRACT

The present invention provides an analog-to-digital converter (ADC), a system-on-chip (SoC) and an electronic control system. In addition to hardware circuits commonly found in conventional ADCs, including a multi-channel input multiplexer, an analog-to-digital conversion (ADC) circuit, a sequence output multiplexer and a sequence data register, the ADC further includes a sequence management circuit and an interrupt generation circuit, which allow the ADC to operate in a streaming access mode, in which it is interrupted only when it has completed the processing of a preset number of sequences. This overcomes the problems with conventional ADCs arising from their frequent interrupts, in particular possible interrupting of a data processing algorithm running on an MCU core due to such frequent interrupts, which may affect real-time control and operation of an electronic system.

20 Claims, 10 Drawing Sheets

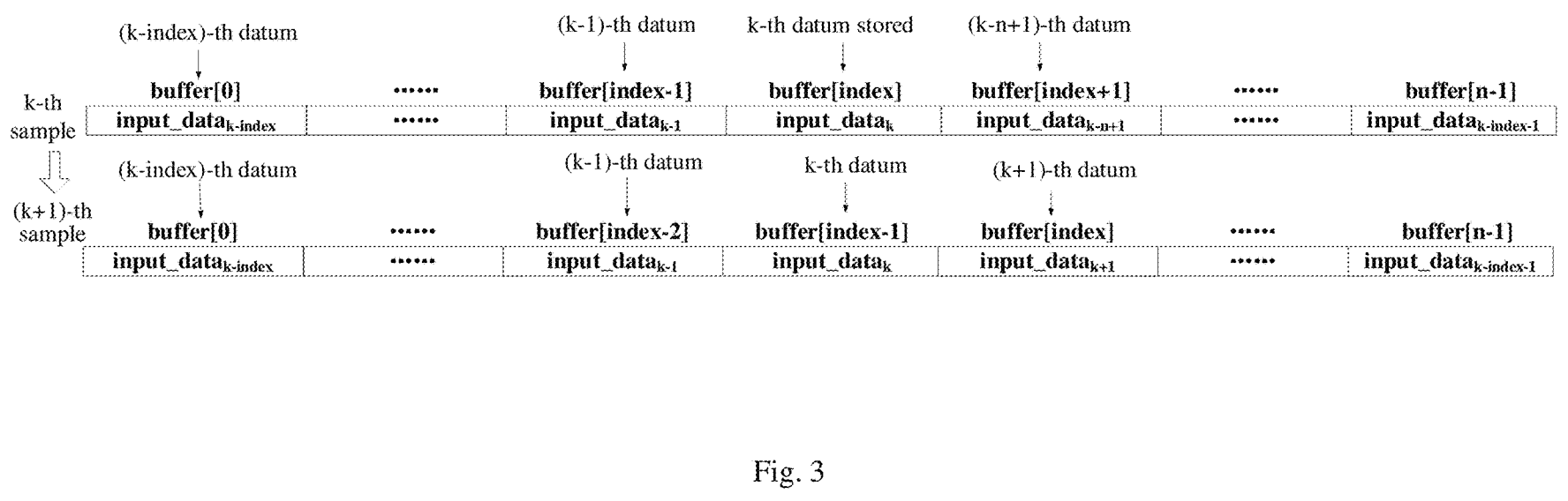

| | (k-index)-th datum | | (k-1)-th datum | k-th datum stored | (k-n+1)-th datum | | |
|---|---|---|---|---|---|---|---|
| k-th sample | buffer[0] | ..... | buffer[index-1] | buffer[index] | buffer[index+1] | ..... | buffer[n-1] |
| | input_data$_{k-index}$ | ..... | input_data$_{k-1}$ | input_data$_k$ | input_data$_{k-n+1}$ | ..... | input_data$_{k-index-1}$ |

| | (k-index)-th datum | | (k-1)-th datum | k-th datum | (k+1)-th datum | | |
|---|---|---|---|---|---|---|---|
| (k+1)-th sample | buffer[0] | ..... | buffer[index-2] | buffer[index-1] | buffer[index] | ..... | buffer[n-1] |
| | input_data$_{k-index}$ | ..... | input_data$_{k-1}$ | input_data$_k$ | input_data$_{k+1}$ | ..... | input_data$_{k-index-1}$ |

Fig. 3

ANALOG-TO-DIGITAL CONVERTER, SYSTEM-ON-CHIP AND ELECTRONIC CONTROL SYSTEM

CROSS-REFERENCES TO RELATED APPLICATION

This application claims the priority of Chinese patent application number 202311799519.6, filed on Dec. 25, 2023, the entire contents of which are incorporated herein by reference.

TECHNICAL FIELD

The present invention relates to the field of electronic systems and, in particular, to an analog-to-digital converter (ADC), a system-on-chip (SoC) and an electronic control system.

BACKGROUND

An analog-to-digital converter (ADC) is mainly used to convert an analog signal, such as voltage, current, pressure, temperature, humidity, displacement or sound, into its digital representation for subsequent processing in an electronic system. There is an increasing demand for ADCs with higher performance that can meet the requirements stemming from the ever-advancing digital communication, digital signal processing, digital measurement, MCU and other techniques, the increasing operating speed of electronic systems and an ever-increasing demand for higher sensitivity of electronic systems.

However, existing ADCs, either integrated in or attached to a microcontroller unit (MCU) chip, only support conversion of each sequence (including at least one channel) in a one-shot conversion mode or a continuous conversion mode. Moreover, after the conversion of each sequence is completed, an interrupt request is generated to allow the MCU to process the converted digital signal using an appropriate data processing algorithm. Accordingly, in order to convert a preset number of sequences, an interrupt is generated after the conversion of each sequence is completed. Such multiple interrupts disrupt execution of the data processing algorithm in the MCU, thus adversely affecting its signal processing performance and speed, and hence the real-time control and operation of the electronic control system incorporating the MCU.

SUMMARY OF THE INVENTION

The present invention provides an ADC including:
a sequence management circuit, which is configured to load a target sequence count for a streaming access mode and generate a multi-channel input control signal and a sequence selection output control signal after the ADC is triggered and activated and to generate a stream interrupt signal when an actual sequence count kept in the ADC reaches the target sequence count;
a multi-channel input multiplexer, which is coupled to the sequence management circuit and is configured to receive an analog signal to be converted and, under the control of the multi-channel input control signal, sequentially strobe associated input channel(s) according to a designated conversion priority order designated by each sequence, thereby generating a sample sequence;

an analog-to-digital conversion (ADC) circuit, which is coupled to the multi-channel input multiplexer and is configured to convert the sample sequence into a corresponding digital sequence;
a sequence output multiplexer, which is coupled to the ADC circuit and a sequence data register and is configured to store the digital sequence output from the ADC circuit into the sequence data register according to a specified sequence sorting scheme under the control of the sequence selection output control signal; and
an interrupt generation circuit, which is coupled to the sequence management circuit and an associated interrupt controller and is configured to notify the interrupt controller when the stream interrupt signal is valid, which then interrupts the ADC.

On the basis of the same inventive concept, the present invention also provides a system-on-chip (SoC) including the ADC of the present invention as defined above.

On the basis of the same inventive concept, the present invention also provides an electronic control system including the SoC of the present invention as defined above.

BRIEF DESCRIPTION OF THE DRAWINGS

Those of ordinary skill in the art would appreciate that the following drawings are presented merely to enable a better understanding of the present invention rather than to limit the scope thereof in any sense. In the drawings:

FIG. 3 schematically depicts data caching using a sliding average filtering algorithm according to an embodiment of the present invention;

DETAILED DESCRIPTION

Figure 1:
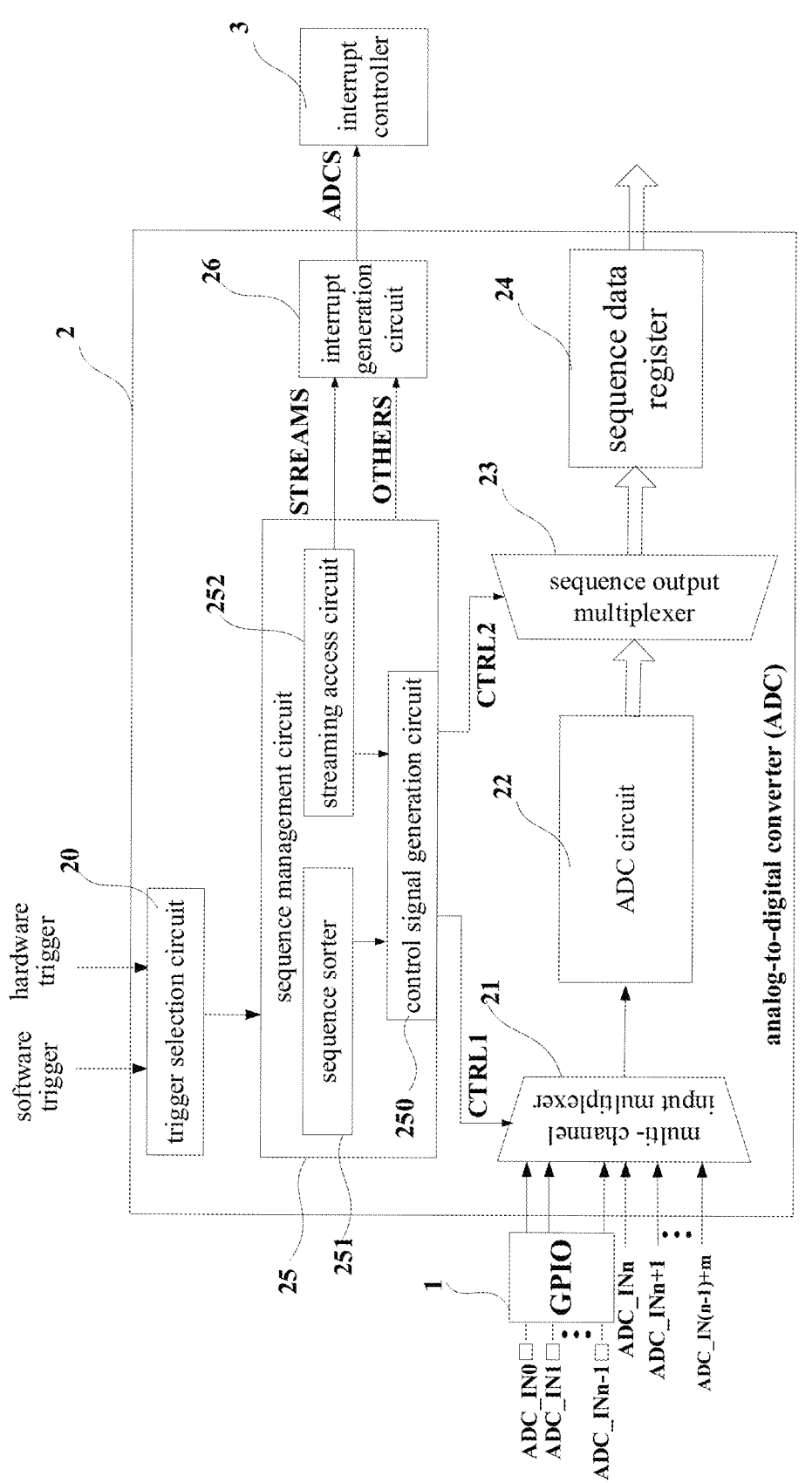
FIG. 1 schematically depicts a hardware architecture of an analog-to-digital converter (ADC) and a microcontroller unit (MCU) chip incorporating the ADC according to an embodiment of the present invention.

The following description sets forth numerous specific details in order to provide a more thorough understanding of the present invention. However, it will be apparent to those skilled in the art that the present invention can be practiced without one or more of these specific details. In other instances, well-known technical features have not been described in order to avoid unnecessary obscuring of the invention. It is to be understood that the invention may be embodied in many different forms and should not be construed as being limited to the embodiments set forth below. Rather, these embodiments are provided so that this disclosure is thorough and conveys the scope of the invention to those skilled in the art. In the drawings, like reference numerals refer to like elements throughout. It will be understood that when an element is referred to as being "connected to" or "coupled to" another element, it can be directly connected or coupled to the other element, or intervening elements may also be present. In contrast, when an element is referred to as being "directly connected to" another element, there are no intervening elements. As used herein, the singular forms "a", "an" and "the" are intended to include the plural forms as well, unless the context clearly indicates otherwise. It will be further understood that the term "comprising" specifies the presence of stated features, steps, operations, elements, and/or components, but do not preclude the presence or addition of one or more other features, steps, operations, elements, components, and/or groups thereof. As used herein, the term "and/or" includes any and all combinations of the associated listed items.

The present invention will be described in greater detail below with reference to the accompanying drawings which illustrate specific embodiments thereof. From the following description, advantages and features of the invention will become more apparent. Note that the figures are provided in a very simplified form not necessarily drawn to exact scale and only for the sake of easier and clearer description of the embodiments disclosed herein.

Referring to FIG. 1, in one embodiment of the present invention, there is provided an analog-to-digital converter (ADC) 2 (referring to hereinafter as the "ADC 2" for short) including a trigger selection circuit 20, a multi-channel input multiplexer 21, an analog-to-digital conversion (ADC) circuit 22, a sequence output multiplexer 23, a sequence data register 24, a sequence management circuit 25 and an interrupt generation circuit 26.

The trigger selection circuit 20 is coupled to the sequence management circuit 25 and is configured to receive a corresponding software trigger signal and/or hardware trigger signal, and to activate the sequence management circuit 25 based on the received trigger signal(s), thereby initializing the ADC 2 and initiating a new cycle of sequence processing after the ADC 2 is interrupted. The software trigger signal may be generated by invoking code in a program stored in an MCU core, to which the ADC 2 is coupled. As a result, the ADC 2 is activated to perform a new cycle of sequence processing. The hardware trigger signal may be generated by a hardware circuit such as a timer. After the completion of each cycle of sequence processing, an actual sequence count may be incremented by 1.

The sequence management circuit 25 is coupled to the multi-channel input multiplexer 21, the sequence output multiplexer 23 and the interrupt generation circuit 26, and is configured to be activated under the action of a trigger signal output from the trigger selection circuit 20. Once the ADC 2 enters a streaming access mode as configured, it is loaded with a target number of sequences (target sequence count) for the streaming access mode and generates a multi-channel input control signal CTRL1 and a sequence selection output control signal CTRL2. Moreover, when an actual sequence count kept in the ADC 2 reaches the target sequence count, it generates a stream interrupt signal STREAMF.

Compared with the prior art, in addition to hardware circuits commonly found in conventional ADCs, including the multi-channel input multiplexer, the ADC circuit, the sequence output multiplexer and the sequence data register, the ADC further includes the sequence management circuit and the interrupt generation circuit, which have been improved. Specifically, after the ADC enters the streaming access mode, the sequence management circuit configures a target sequence count for the streaming access mode and generates a multi-channel input control signal and a sequence selection output control signal. Moreover, when an actual sequence count kept in the ADC reaches the target sequence count, the sequence management circuit generates a stream interrupt signal. Upon receiving the stream interrupt signal which is valid, the interrupt generation circuit can notify the interrupt controller, which then interrupts the ADC. With this arrangement, the ADC can operate in the streaming access mode, in which it is interrupted only when it has completed the processing of a preset number of sequences (each designated with or including one or more channels). This overcomes the problems with conventional ADCs arising from their frequent interrupts, in particular possible interrupting of a data processing algorithm running on a microcontroller unit (MCU) core due to such frequent interrupts, which may affect real-time control and operation of an electronic system. The ADC is particularly suited to use in high-frequency applications requiring an ADC to process sequences at a very high speed (especially when a small number of channels are designated for each sequence), because it is unnecessary to interrupt the ADC at the end of processing of each sequence and untimely interrupt response that may occur due to the generation of a new interrupt during an ongoing interrupt is therefore avoided.

In this embodiment, the sequence management circuit 25 includes a control signal generation circuit 250, a sequence sorter 251 and a streaming access circuit 252. The streaming access circuit 252 is configured to be loaded with a target sequence count automatically or by software after the ADC 2 is triggered and activated (i.e., the trigger selection circuit 20 activates operation of the streaming access circuit 252 according to a received trigger signal). Moreover, when an actual sequence count kept in the ADC 2 reaches the target sequence count, it generates a stream interrupt signal STREAMF. The sequence sorter 251 is configured to configure a designated conversion priority order designated by each sequence (i.e., a conversion priority order for all the strobed input channels, according to which each sample sequence is output from the multi-channel input multiplexer) and a sequence sorting scheme, according to which digital sequences are stored in the sequence output multiplexer 23. Each sequence includes one or more of input channels ADC_IN0-ADC_IN(n−1)+m and designates a sample conversion priority order (referred to hereinafter as a "conversion priority order" for short) for the included input channel(s). For example, a sequence may include input channels ADC_IN2, ADC_IN3 and ADC_IN5 and may designate a conversion priority order for the three input channels as "ADC_IN5-ADC_IN2-ADC_IN3". As another example, another sequence may only include the input channel ADC_IN1. In this case, it is unnecessary to designate a conversion priority order for the only sequence. In other words, as each strobed input channel transmits a sample signal (which may indicate one or more sample values) of a different type, when the number of strobed input channels is greater than 1, then the analog signals to be converted are a set of analog signals consisting of sample signals transmitted by those strobed input channels, and each sample sequence is in fact a combination of the sample signals output from those strobed input channels. For each sequence, the ADC 2 sequentially converts, according to the designated conversion priority order designated by each sequence, sample signals provided by the input channels included therein, which are sequentially turned on, into corresponding digital signals. The resulting digital signals are then sequentially stored by the sequence output multiplexer 23 according to a specified sequence sorting scheme (also referred to as a data storage scheme) into the sequence data register 24. For each sample sequence, an analog-to-digital converted digital sequence is obtained when a digital signal converted from the last sample signal in the input channel of the sample sequence that is turned on at last is stored in the sequence data register 24.

An input side of the multi-channel input multiplexer 21 is coupled to (n+M) input channels ADC_IN0-ADC_IN(n−1)+ m. A control terminal of the multi-channel input multiplexer 21 is coupled to the sequence management circuit 24. An output side of the multi-channel input multiplexer 21 is coupled to an input terminal of the ADC circuit 22. The multi-channel input multiplexer 21 is configured to receive each analog signal to be converted (i.e., each sequence) and generate a sample sequence by sequentially strobing, under the control of a multi-channel input control signal CTRL1, associated input channel(s) according to a conversion priority order designated for the sequence. Notably, in this embodiment, for each sequence, the same input channel(s) is/are selected and designated with a consistent conversion priority order. For example, for each sequence, the same input channels including ADC_IN2, ADC_IN3 and ADC_IN5 are selected, and the three input channels are always converted according to the conversion priority order: ADC_IN5-ADC_IN2-ADC_IN3. Of course, the present invention is not so limited, because in other embodiments, for each sequence, a different set of input channel(s) may be selected, and a conversion priority order may be designated for the input channel(s).

As an example, the ADC 2 may be integrated with a hardware module such as an MCU core to form an MCU chip (i.e., an MCU system-in-package (SiP)). In this case, the former n input channels ADC_IN0-ADC_IN(n−1) may be coupled to the input side of the multi-channel input multiplexer 21 via a general-purpose I/O interface (GPIO) 1 of the MCU chip, and the latter m input channels ADC_INn-ADC_IN(n−1)+m may be coupled to the input side of the multi-channel input multiplexer 21 via a communication bus (e.g., an SPI bus) between the MCU core and the ADC 2.

The ADC circuit 22 is configured to convert an output sample sequence from the multi-channel input multiplexer 21 into a corresponding digital sequence (each digital signal may be considered as one data).

An input terminal of the sequence output multiplexer 23 is coupled to an output terminal of the ADC circuit 22. An output terminal of the sequence output multiplexer 23 is coupled to the sequence data register 24. A control terminal of the sequence output multiplexer 23 is coupled to the sequence management circuit 25. The sequence output multiplexer 23 stores, under the control of a sequence selection output control signal CTRL2, a digital sequence output from the ADC circuit 22 into the sequence data register 24 according to a sequence sorting scheme specified by the sequence sorter 251.

In this embodiment, the streaming access mode of the ADC 2 may be a circular streaming access mode, or a linear streaming access mode. In the circular streaming access mode, the sequence output multiplexer 23 stores a digital sequence that it outputs into the sequence data register 24 sequentially (e.g., circularly from the least to most significant address, or from the most to least significant address). Due to limited capacity of the sequence data register 24 (e.g., it can store at most n data), when the sequence data register 24 reaches its storage limit while the ADC 2 is still performing sequence processing, any subsequent datum (i.e., digital signals produced by the ADC 2) will override the first stored datum in the sequence data register 24 in a first-in first-out (FIFO) manner. In this way, it is ensured that the sequence data register 24 always stores the latest n data.

An input terminal of the interrupt generation circuit 26 is coupled to a corresponding signal output terminal of the sequence management circuit 25. An output terminal of the interrupt generation circuit 26 is coupled to an interrupt controller 3 outside of the ADC 2. The interrupt generation circuit 26 is configured to, when receiving a valid stream interrupt signal STREAMF output from the sequence management circuit 25, notify the interrupt controller 3 of it, thus allowing the MCU core to interrupt the ADC 2. In this embodiment, the interrupt generation circuit 26 is also configured to, when receiving any other valid interrupt signal OTHERS than a valid stream interrupt signal STREAMF produced by the sequence management circuit 25, also notify the interrupt controller 3, allowing the MCU core to interrupt the ADC 2. In this way, the interrupt generation circuit 26 can perform a logic OR operation on a stream interrupt signal STREAMF or any other interrupt signal OTHERS to enable the interrupt controller 3 to be notified, when in the streaming access mode, of an actual sequence count kept in the ADC 2 reaching a target sequence count in a timely manner to allow the MCU core to interrupt the ADC 2. Moreover, when it is necessary to forcedly interrupt the ADC 2 when in the streaming access mode, or in another mode, it is made possible to trigger an interrupt of the ADC 2 in a timely manner.

It should be understood that each of the trigger selection circuit 20, the multi-channel input multiplexer 21, the ADC circuit 22, the sequence output multiplexer 23, the sequence data register 24, the sequence sorter 251, the interrupt generation circuit 26 and the control signal generation circuit 250, the sequence sorter 251 and the streaming access circuit 252 in the sequence management circuit 25 may be implemented by any suitable circuit design. Moreover, each of the trigger selection circuit 20, the multi-channel input multiplexer 21, the ADC circuit 22, the sequence output multiplexer 23, the sequence data register 24, the interrupt generation circuit 26 and the control signal generation circuit 250 and the sequence sorter 251 in the sequence management circuit 25 may be implemented by a conventional circuit design known in the art, which is not described in further detail herein though.

Figure 2:
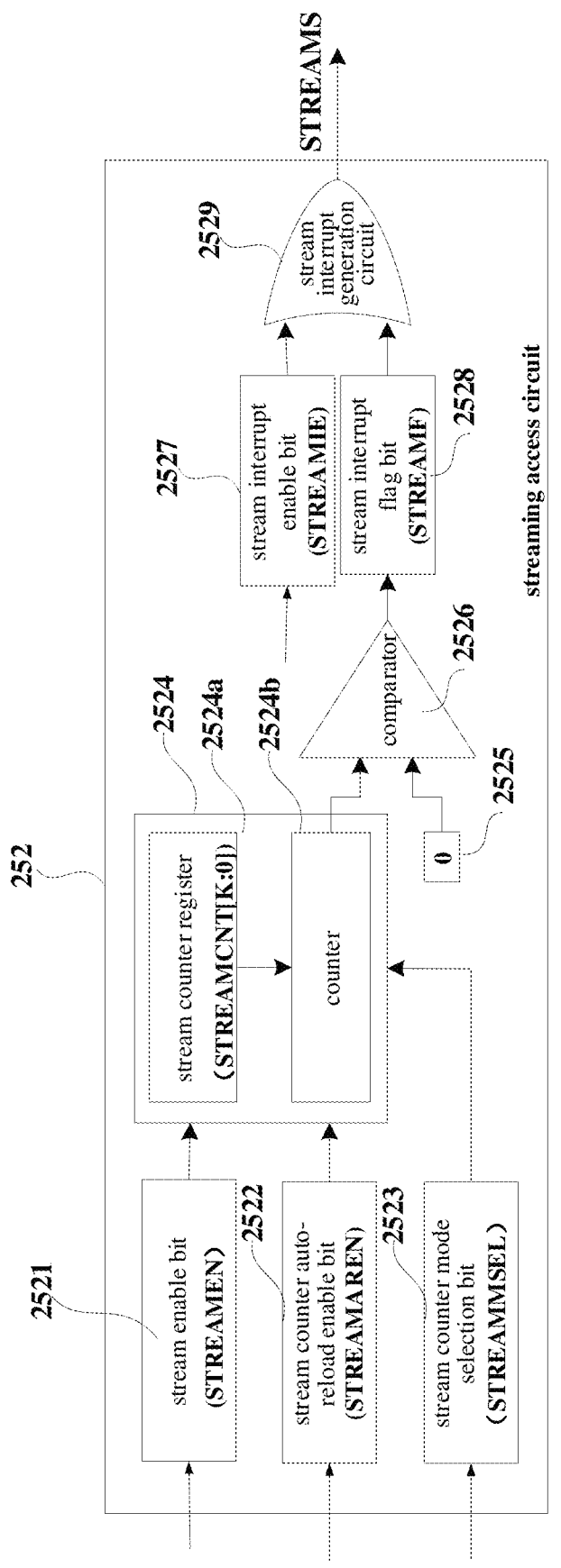
FIG. 2 schematically depicts a hardware architecture of a streaming access circuit in an ADC according to an embodiment of the present invention.

As an example, referring to FIG. 2, the streaming access circuit 252 in the sequence management circuit 25 includes a stream enable bit (STREAMEN) 2521, a stream counter auto-reload enable bit 2522, a stream counter mode selection bit (STREAMMSEL) 2523, a counting circuit 2524, a reference circuit 2525, a comparator 2526, a stream interrupt enable bit (STREAMIE) 2527, a stream interrupt flag bit (STREAMF) 2528 and a stream interrupt generation circuit 2529. The counting circuit 2524 includes a stream counter register 2524a and a counter 2524b.

The stream enable bit 2521 is set invalid (e.g., STREAMEN=0) by default when powered on.

After the ADC 2 is triggered and activated, when the stream enable bit 2521 is set valid (e.g., STREAMEN=1), the streaming access mode of the ADC 2 is enabled, allowing the ADC 2 to support the processing of a preset number of sequences. As a result, the streaming access circuit 252 is allowed to load a target sequence count.

After the ADC 2 is triggered and activated, when the stream enable bit 2521 is set invalid (e.g., STREAMEN=0), the streaming access mode of the ADC 2 is disabled. As a result, the streaming access circuit 252 is disallowed to load a target sequence count.

The stream counter register 2524a is coupled to the stream enable bit 2521 and store the value 0 by default (i.e., STREAMCNT=0) when powered on. After the ADC 2 is triggered and activated (i.e., after the ADC 2 has been initialized), the value stored in the stream counter register 2524a is set to a non-zero value (i.e., STREAMCNT≠0, and the non-zero value may be, for example, written by software), which indicates a target sequence count in the streaming access mode. That is, once the value stored in the stream counter register 2524a is changed from 0 to an appropriate non-zero value, it is indicated that a target sequence count has been loaded in the counting circuit 2524. During sequence processing by the ADC 2 in the streaming access mode, the value stored in the stream counter register 2524a represents the number of remaining unprocessed sequences (i.e., the difference between an actual sequence count kept in the ADC 2 and said target sequence count). In the streaming access mode, every time when the ADC 2 completes the processing of a sequence, the counter 2524b decrements the value stored in the stream counter register 2524a by 1. The processing of each sequence by the ADC 2 involves: the multi-channel input multiplexer sequentially turning on, under the control of the sequence management circuit 25, designated input channel(s) of the sequence according to a designated conversion priority order (thereby generating a sample sequence) designated by each sequence; the ADC circuit 22 converting sample signal(s) output from the respective turned-on input channel(s) into digital signal(s) (thereby generating a digital sequence); under the control of the sequence management circuit 25, the sequence output multiplexer 23 storing the digital signal(s) output from the ADC circuit 22 at respective position(s) in the sequence data register according to a specified sequence sorting scheme (or called a data storage scheme), thereby completing the storage of the digital sequence and processing of the sequence.

The reference circuit 2525 is configured to provide 0 as a reference value 0. The comparator 2526 is coupled to the stream counter register 2524a and the reference circuit 2525 and is configured to, in the streaming access mode, compare a difference stored in the stream counter register with 0 to determine whether the difference has been decremented to 0 and thereby determine whether an actual sequence count kept in the ADC 2 has reached a target sequence count.

When the stream interrupt enable bit 2527 is set valid (e.g., STREAMIE=1), an interrupt of the ADC 2 is enabled in the streaming access mode (i.e., the ADC 2 is allowed to be interrupted in the streaming access mode). When the stream interrupt enable bit 2527 is set invalid (e.g., STREAMIE=0), an interrupt of the ADC 2 is disabled in the streaming access mode interrupt (i.e., the ADC 2 is disallowed to be interrupted in the streaming access mode).

The stream interrupt flag bit 2528 is coupled to an output terminal of the comparator 2526, and is set valid (e.g., STREAMF=1) in the streaming access mode, when the comparator 2526 determines that a difference stored in the stream counter register 2524a has been decremented to 0 (i.e., when a target sequence count for the ADC 2 has been reached). Otherwise, it is always set invalid (e.g., STREAMF=0).

The stream interrupt generation circuit 2529 is configured to perform a logic AND operation on the stream interrupt flag bit 2528 and the stream interrupt enable bit 2527, and to generate a valid stream interrupt signal STREAMS (e.g., STREAMS=1) only when both the stream interrupt flag bit

2528 and the stream interrupt enable bit 2527 are set valid (e.g., STREAMIE=1 and STREAMF=1), which triggers an interrupt of the ADC 2 in the streaming access mode. Otherwise, it always generates invalid STREAMS (e.g., STREAMS=0). This can avoid any undesired interrupt of the ADC 2 from being triggered in the streaming access mode. In this way, when in the streaming access mode, the ADC 2 can be reliably interrupted when an actual sequence count reaches a corresponding target sequence count, allowing the ADC 2 to only process a preset number of sequences (that corresponds to the target sequence count).

The stream counter auto-reload enable bit 2522 is coupled to the counting circuit 2524, and the stream counter auto-reload enable bit 2522 is set invalid (e.g., STREAMAREN=0) when powered on by default.

After the ADC 2 enters the streaming access mode, when the stream counter auto-reload enable bit 2522 is set invalid (e.g., STREAMAREN=0), the stream counter register 2524a is disabled from automatically reloading a target sequence count. As a result, in the streaming access mode, when the ADC 2 has completed the processing of a preset number of sequences (i.e., when an actual sequence count has reached a target sequence count, i.e., when the difference between them stored in the stream counter register 2524a has been decremented to 0), it stops processing any sequence until it is again triggered and activated to process another preset number of sequences. In this way, the ADC 2 can operate in a one-shot conversion style in the streaming access mode.

After the ADC 2 enters the streaming access mode, when the stream counter auto-reload enable bit 2522 is set valid (e.g., STREAMAREN=1), the stream counter register 2524a is enabled to automatically reload a target sequence count. As a result, in the streaming access mode, after the ADC 2 completes the current cycle of sequence processing (i.e., when an actual sequence count in the current cycle reaches a target sequence count prescribed for the current cycle, i.e., when the difference between these counts stored in the stream counter register 2524a has been decremented to 0), it continues to carry out a new cycle of sequence processing. In this way, the ADC 2 can operate in a continuous conversion fashion in the streaming access mode.

The stream counter mode selection bit 2523 is coupled to the counting circuit 2524 and is set invalid (e.g., STREAMMSEL=0) by default when powered on.

After the ADC 2 enters the streaming access mode, when the stream counter mode selection bit 2523 is set invalid (e.g., STREAMMSEL=0), regardless of whether a difference stored in the stream counter register 2524a is decremented to 0, and of whether the stream counter auto-reload enable bit 2522 is set valid, the ADC 2 continues sequence processing (i.e., the ADC circuit 22 continues to convert a received sample sequence to a corresponding digital sequence). In other words, how the stream counter auto-reload enable bit 2522 is set has no impact on sequence processing of the ADC 2, even when a difference stored in the stream counter register 2524a has been decremented to 0.

In contrast, after the ADC 2 enters the streaming access mode, when the stream counter mode selection bit 2523 is set valid (e.g., STREAMMSEL=1), if the stream counter auto-reload enable bit 2522 is set valid (e.g., STREAMAREN=1), then upon a difference stored in the stream counter register 2524a being decremented to 0, the ADC 2 will be interrupted or not, depending on set values of the stream interrupt flag bit 2528 and of the stream interrupt enable bit 2527 (e.g., it is interrupted when STREAMIE=1 and STREAMF=1), and the stream counter register 2524a will automatically reload a target sequence count, allowing the ADC 2 to perform another cycle of sequence processing (i.e., the ADC circuit 22 continues to convert a received sample sequence into a corresponding digital sequence). With the stream counter mode selection bit 2523 being set valid (e.g., STREAMMSEL=1), if the stream counter auto-reload enable bit 2522 is set invalid (e.g., STREAMAREN=0), then upon a difference stored in the stream counter register 2524a being decremented to 0, as the function of the stream counter register 2524a to automatically reload a target sequence count is disabled, the ADC 2 will stop sequence processing (i.e., the ADC circuit 22 will not convert any received sample sequence into a digital sequence). Moreover, the ADC 2 is interrupted or not, depending on set values of the stream interrupt flag bit 2528 and the stream interrupt enable bit 2527 (e.g., it is interrupted when STREAMIE=1 and STREAMF=1). In this case, the ADC 2 restarts sequence processing only when a target sequence count is reloaded to the stream counter register 2524a by software.

As can be seen, with both the stream counter mode selection bit 2523 and the stream counter auto-reload enable bit 2522 being set invalid (e.g., when STREAMMSEL=0 and STREAMAREN=0) in a one-shot conversion mode, only when the value in the stream counter register 2524a is reset to a non-zero value, i.e., reloaded with a target sequence count STREAMCNT, the ADC 2 will restart a new cycle of sequence processing upon the trigger selection circuit 20 receiving a new trigger signal. However, in a continuous conversion mode, only when the stream counter auto-reload enable bit 2522 is reset valid, the stream counter register 2524a will be automatically reloaded with a target sequence count, allowing the ADC 2 to restart sequence processing.

It should be understood that the streaming access mode of the ADC 2 of the present invention can support either a circular streaming access mode, or a linear streaming access mode.

As an example, referring to FIGS. 1 and 3, the sequence output multiplexer 23 may store digital signals output from the ADC circuit 22 into the sequence data register 24 according to a sequence sorting scheme (or data storage scheme) specified for the circular streaming access mode. For example, the capacity of the sequence data register 24 supports storage of only an n-long array (consisting of n digital signals, i.e., n input data input_data). In FIG. 3, "index" represents an address index indicative of the address of the latest data. For the k-th sample, the latest datum input_data$_k$ is stored in buffer [index], while the datum input_data$_{k-index}$ is stored in buffer [0] and the earliest datum input_data$_{k-n+1}$ in buffer [index+1]. For the (k+1)-th sample, upon the arrival of the latest datum input_data$_{k+1}$, the sequence output multiplexer 23 stores it in buffer [index+1] and increments "index" by 1 to redirect it to the latest datum.

In other words, once the sequence data register 24 becomes full, the sequence output multiplexer 23 stores subsequent data in a cyclic FIFO manner involving overriding the earliest (oldest) digital signal in the sequence data register 24 with the latest digital signal (i.e., the latest datum). This ensures that the n data stored in the sequence data register 24 consistently form the latest combination (i.e., the latest digital sequence).

Assuming a sliding average filtering algorithm is applied to the n data stored in the sequence data register 24, when denoting the sum of the n data stored in the sequence data register 24 after the k-th sample is obtained as sum$_k$, the average of the n data is given as:

$$average\_value_k = \frac{sum_k}{n}.$$

Moreover, the average of the n data stored in the sequence data register 24 after the (k+1)-th sample is obtained is given as:

$$average_{value_{k+1}} = \frac{sum_k - input_{data_{k-n+1}} + input_{data_{k+1}}}{n} =$$
$$average\_value_k + \frac{input_{data_{k+1}} - input_{data_{k-n+1}}}{n}.$$

Thus, the ADC 2 is applicable to various applications requiring sliding average filtering by allowing overriding historical data with latest data to ensure that the n data stored in the sequence data register 24 are always the latest values. Moreover, only a small computational burden is required to handle each new datum for sliding average filtering.

In the linear streaming access mode, when the number of sample sequences that the ADC 2 has processed reaches a preset value, the sequence output multiplexer 23 may no longer store any latest digital signal into the sequence data register 24, and the data stored in the sequence data register 24 may therefore not be updated anymore.

Therefore, the ADC of the present invention achieves processing of a preset number of sequences by means of hardware. It can process sample data in a streaming access mode, without being interrupted to check whether an actual sequence count reaches a target sequence count at the end of processing of each sequence. This overcomes the disadvantages arising from frequent interrupts, in particular in high-frequency applications requiring an ADC to process sequences at a very high speed (especially when a small number of channels are designated for or included in each sequence). The present invention dispenses with the need to interrupt the ADC at the end of processing of each sequence, avoiding untimely interrupt response that may occur due to the generation of a new interrupt during an ongoing interrupt.

In one embodiment of the present invention, there is provided a system-on-chip (SoC) including the ADC of the present invention as defined above. Since the SoC incorporates the ADC of the present invention, it can operate in a streaming access mode, in which it is interrupted only when the processing of a preset number of sequences has been completed. This overcomes the problem that a data processing algorithm running on the SoC may be interrupted due to frequent interrupts of the ADC, which may affect real-time control and operation of an electronic system in which the SoC is employed. The present invention is particularly suited to use in high-frequency applications requiring an ADC to process sequences at a very high speed (especially when a small number of channels are designated for each sequence), because it is unnecessary to interrupt the ADC at the end of processing of each sequence and untimely interrupt response that may occur due to the generation of a new interrupt during an ongoing interrupt is therefore avoided.

Figure 4:
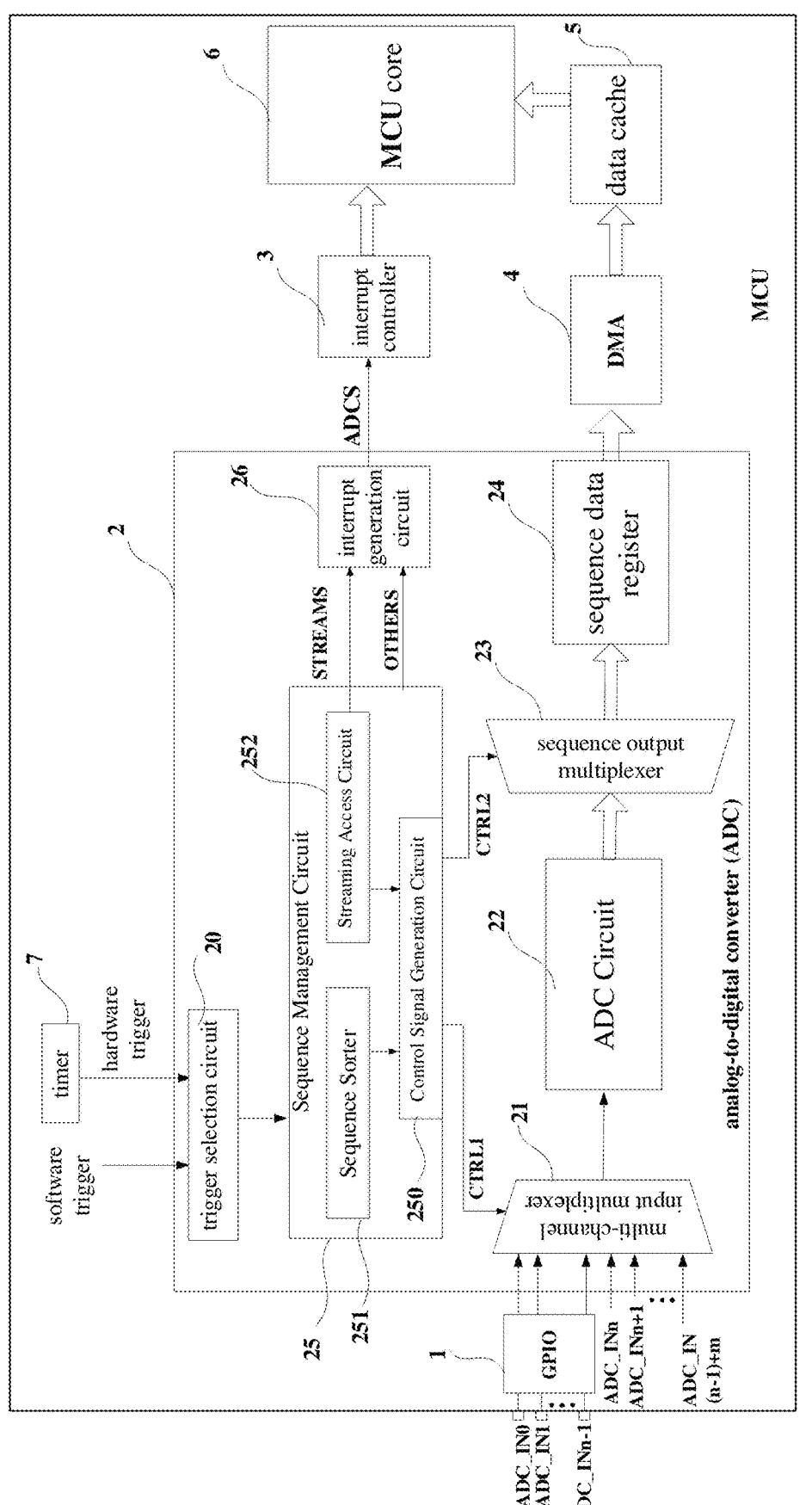
FIGS. 4 to 5 schematically depict hardware architectures of two examples of a system-on-chip (SoC) according to an embodiment of the present invention.

In this embodiment, referring to FIG. 4, the SoC is an MCU chip MCU including an MCU core 6, an interrupt controller 3, an I/O interface 1 and the ADC 2 of the present invention, which are integrated on a single chip.

The I/O interface 1 is coupled to the ADC 2 and configured to provide incoming external analog signals ADC_IN0-ADC_INn−1 to the ADC 2. The ADC also receives analog signals ADC_INn-ADC_IN(n−1)+m from a 2 communication bus, which are provided by the MCU core 6.

The microcontroller unit (MCU) core 6 is coupled to the ADC 2, for example, by the communication bus and adapted to configure signals for the ADC 2. For example, with combined reference to FIGS. 1 and 2, the MCU core 6 may provide the ADC 2 with a software trigger signal and configure the value in the stream counter register 2524*a* in the streaming access circuit 252 of the ADC 2 (to assign a target sequence count for the streaming access mode). Moreover, it may set information bits valid, invalid or otherwise, including the stream enable bit 2521, the stream counter auto-reload enable bit 2522, the stream counter mode selection bit 2523, the stream interrupt enable bit 2527 and the stream interrupt flag bit 2528. The MCU core 6 is also configured to process a digital sequence stored in the sequence data register 24 of the ADC 2.

The interrupt controller 3 is coupled to an output terminal of the ADC 2 and the MCU core 6 and is configured to, upon receiving a valid interrupt signal (examples thereof include a valid stream interrupt signal STREAMF and other valid interrupt signals OTHERS) from the ADC 2, raise an interrupt request to the MCU core 6, which requires the MCU core 6 to interrupt the ADC 2.

Since the SoC incorporates the ADC 2 of the present invention, it can operate in a streaming access mode, in which it is interrupted only when the processing of a preset number of sequences has been completed. This overcomes the problem that a data processing algorithm running on the SoC may be interrupted due to frequent interrupts of the ADC 2, which may affect real-time control and operation of an electronic system in which the SoC is employed. The present invention is particularly suited to use in high-frequency applications requiring an ADC to process sequences at a very high speed (especially when a small number of channels are designated for each sequence), because it is unnecessary to interrupt the ADC at the end of processing of each sequence and untimely interrupt response that may occur due to the generation of a new interrupt during an ongoing interrupt is therefore avoided.

As an example, referring to FIG. 4, the MCU chip further includes a direct memory access (DMA) controller 4 and a data cache 5. The data cache 5 may be a random-access memory (RAM) or the like. The DMA controller 4 is configured to transfer a digital sequence stored in the sequence data register 24 of the ADC 2 to the data cache 5, and the MCU core 6 may be able to directly access and process the digital sequence stored in the data cache 5. This enables faster data access and reductions in operational overhead of the MCU core 6. In this example, in the MCU chip, at least one of the DMA controller 4, the interrupt controller 3 and the data cache 5 is integrated with the MCU core 6 in a first die (MCU die), while the ADC 2 is integrated in a second die (ADC die). In other examples, the DMA controller 4 and the MCU core 6 are integrated in a first die (MCU die), the ADC 2 in a second die (ADC die), and the interrupt controller 3 or the data cache 5 in a third die. This enables easier fabrication of the MCU chip.

Figure 5:
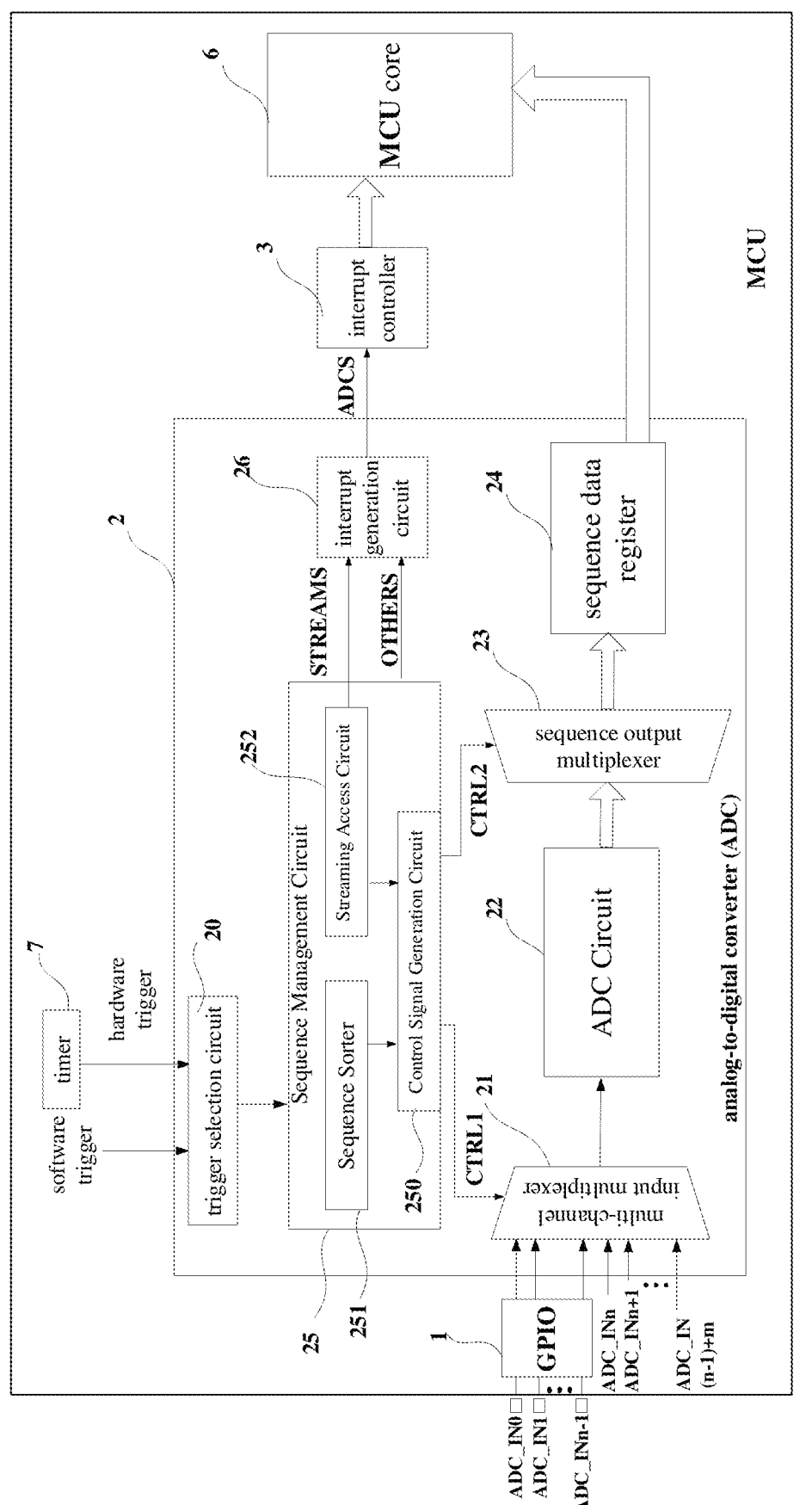
Figure 6:
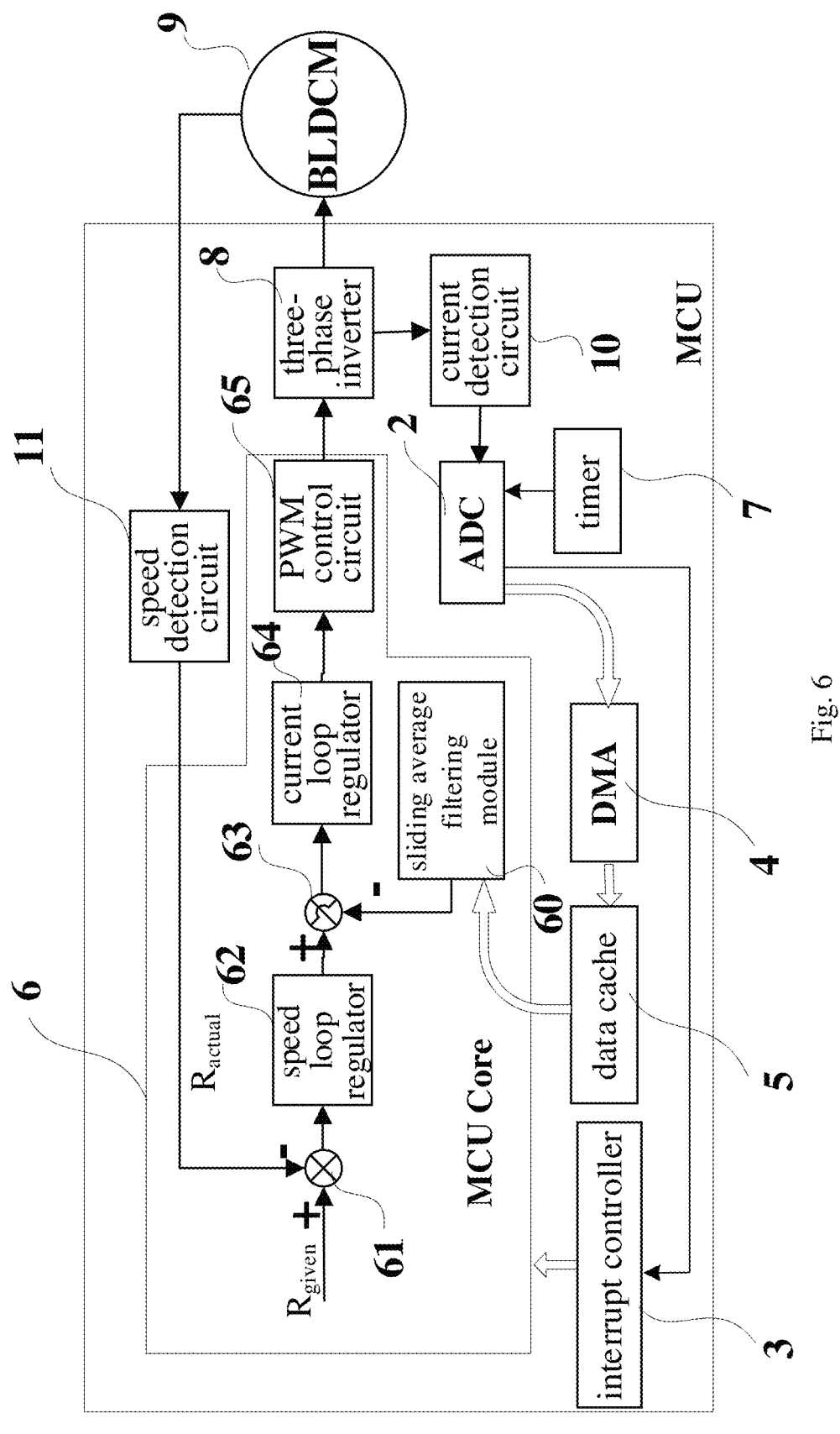
FIGS. 6 to 7 schematically depict hardware architectures of two examples of an electronic control system according to an embodiment of the present invention.

As an example, referring to FIG. 6, the MCU core 6 includes a sliding average filtering module 60, the sliding average filtering module 60 is used for subjecting n data read from the sequence data register of the ADC 2 or from the data cache 5 to sliding average filtering. This operation results in an average of the data, where n is an integer greater than 1. It should be understood that, in other embodiments of the present invention, the DMA controller 4 and the data cache 5 may be omitted, as shown in FIG. 5, as long as allowed by the performance of the MCU chip.

In other embodiments of the present invention, the SoC may be a stand-alone ADC chip arranged outside the MCU chip (not shown). The ADC chip is coupled to the external MCU chip that incorporates the interrupt controller and the MCU core.

Figure 7:
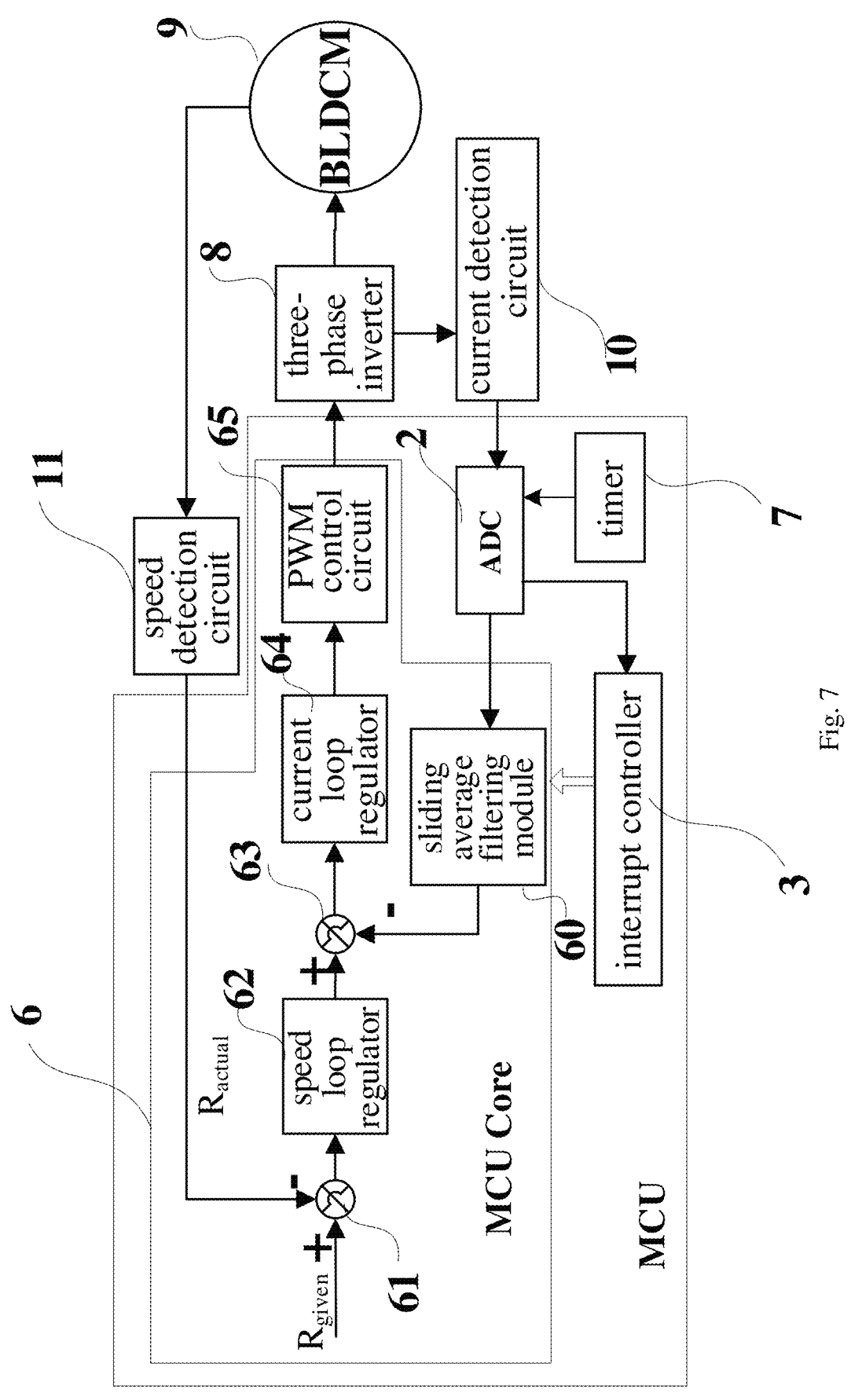

On the basis of the same inventive concept, referring to FIGS. 6 and 7, in one embodiment of the present invention, there is provided an electronic control system including the SoC of the present invention as defined above. Since the electronic control system incorporates the SoC of the present invention, the ADC in the SoC of the present invention allows operation in a streaming access mode, in which it is interrupted only when the processing of a preset number of sequences (each designated with or including one or more channels) has been completed. This overcomes the problem that a data processing algorithm running on the SoC may be interrupted due to frequent interrupts of the ADC, which may affect real-time control and operation of the electronic system. The present invention is particularly suited to use in high-frequency applications requiring an ADC to process sequences at a very high speed (especially when a small number of channels are designated for each sequence), because it is unnecessary to interrupt the ADC at the end of processing of each sequence and untimely interrupt response that may occur due to the generation of a new interrupt during an ongoing interrupt is therefore avoided.

The electronic control system of the present invention will be described in detail below in the context of its use for the control of a brushless direct-current (BLDC) motor, as an example, to demonstrate benefits of the electronic control system that incorporates the ADC of the present invention. In this example, the electronic control system of the present invention serves as a control system for the BLDC motor.

In the automotive field, BLDC motors are used with electric power steering (EPS) systems, wipers, oil pumps, water pumps, cooling fans and other components of vehicles. BLDC motors do not include an electric brush or commutator and can be suitably used in limited space applications. Moreover, they are free of general wear, sparks and noise and can provide good control in specific in-vehicle applications. Their properties including high durability, high efficiency, low cost, a high operating speed and electronic controllability make them ideal continuously operable automotive components.

Referring to FIG. 6, a BLDC motor 9 is usually controlled using a six-step square-wave commutation technique, in which during normal startup and operation of the BLDC motor 9, in addition to speed changes, it will also experience transient and steady-state changes in current and torque. Through adding closed-loop current control to closed-loop speed control (i.e., double closed-loop current and speed control), response of the BLDC motor 9 during startup, acceleration and load variations can be effectively regulated.

Referring to FIG. 6, the control system for the BLDC motor 9 includes an MCU chip, the MCU chip includes an ADC 2, an interrupt controller 3, an DMA controller 4, a data cache 5, a microcontroller unit (MCU) core 6, a timer 7, a three-phase inverter 8, a current detection circuit 10 and a speed detection circuit 11. The MCU core 6 includes a sliding average filtering module 60, a first superimposer 61, a speed loop regulator (also known as a PID speed regulator) 62, a second superimposer 63, a current loop regulator (also known as a PID current regulator) 64 and a pulse-width modulation (PWM) controller 65. The ADC 2 is an ADC embodying the present invention.

The DMA controller 4 is configured to transfer a digital sequence from a sequence data register in the ADC 2 to the data cache 5. The sliding average filtering module 60 is configured to subject a digital sequence stored in the data cache 5 to sliding average filtering. This operation results in an average current value.

The current detection circuit 10 is coupled to the three-phase inverter 8 and configured to detect a current in the BLDC motor 9 and provide the detected current to the ADC 2. The timer 7 is coupled to the ADC 2. The timer 7 is configured to generate, at a predetermined time interval, hardware trigger signals for triggering analog-to-digital conversion of a detected current from the current detection circuit 10 by the ADC 2. Optionally, during hardware triggering of the ADC 2 by the timer 7, a stream counter register in the ADC 2 may be enabled, when a difference stored therein is decremented to 0, to automatically load a target sequence count. In this way, after the ADC 2 completes the current cycle of sequence processing, it will automatically start a new cycle of sequence processing, allowing data stored in the sequence data register and hence data stored in the data cache 5 to be updated. As such, data updating can be achieved as required by the sliding average filtering module 60.

The speed detection circuit 11 is directly coupled to a rotating shaft of the BLDC motor and configured to detect a rotating speed of the BLDC motor 9 and provide the detected speed $R_{actual}$ to the first superimposer 61 in the MCU core 6 (e.g., to a negative input terminal "−" of the first superimposer 61). The first superimposer 61 is configured to superimpose a given speed $R_{given}$ (which is, for example, input to a positive input terminal "+" of the first superimposer 61) with a detected speed $R_{actual}$ from the speed detection circuit 11 (e.g., the superimposition of $R_{given}$ with $R_{actual}$ may be a subtraction operation). The speed loop regulator 62 is a primary regulator in the speed regulation system. An output of the speed loop regulator 62 (which is a speed regulation signal varying as a function of $R_{given}$) is provided as an input to the second superimposer 63 (e.g., to a positive input terminal "+" of the second superimposer 63). An output of the sliding average filtering module 60 is provided as another input to the second superimposer 63 (e.g., to a negative input terminal "−" of the second superimposer 63). An output of the second superimposer 63 is provided as an input to the current loop regulator 64. The second superimposer 63 superimposes an average current value output from the sliding average filtering module 60 with a speed regulation signal output from the speed loop regulator 62 (e.g., the superimposition may be a subtraction operation). An output of the current loop regulator 64 is provided as an input to the PWM controller 65. The PWM controller 65 outputs a drive signal (which is a three-phase voltage) for driving operation of the three-phase inverter 8. In this way, speed control of the BLDC motor 9 can be achieved.

The first superimposer 61 cooperates with the speed loop regulator 62 to allow the speed of the BLDC motor 9 to vary as a function of the given speed $R_{given}$ during dynamic operation and to eliminate or minimize a net difference between them during steady-state operation. The speed loop regulator 62 acts to counteract interference from a load, and its output determines the magnitude of a current through a bus in the BLDC motor 9. The second superimposer 63 cooperates with the current loop regulator 64 to allow the current through the bus in the BLDC motor 9 to vary sensitively as a function of the output of the speed loop regulator 62 (or more precisely, as a function of the given speed $R_{given}$).

Figure 8:
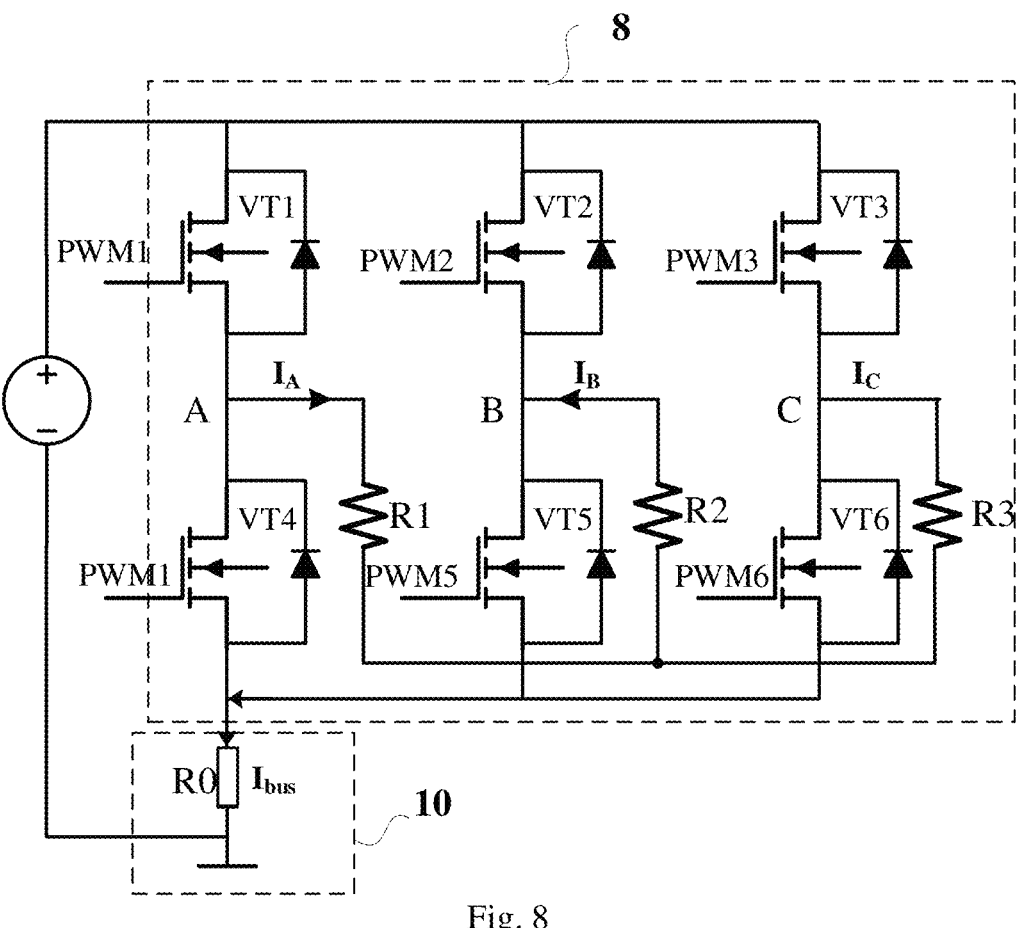
FIG. 8 is a schematic circuit diagram of a three-phase inverter in an electronic control system according to an embodiment of the present invention.

Referring to FIG. 8, the three-phase inverter 8 is composed of connected MOS transistors VT1-VT6 and resistors R1-R3, and the current detection circuit 10 is composed of a resistor R0. The MOS transistors VT1-VT3 function as upper drive transistors, and the MOS transistors VT4-VT6 as lower drive transistors. The MOS transistors VT1 and VT4 are coupled to each other to provide a phase-A leg of the three-phase inverter 8 (which is a connection node of the MOS transistors VT1 and VT4), and one end of the resistor R1 is connected to the phase-A leg of the three-phase inverter 8. The MOS transistors VT2 and VT5 are coupled to each other to provide a phase-B leg of the three-phase inverter 8 (which is a connection node of the MOS transistors VT2 and VT5), and one end of the resistor R2 is connected to the phase-B leg of the three-phase inverter 8. The MOS transistors VT3 and VT6 are coupled to each other to provide a phase-C leg of the three-phase inverter 8 (which is a connection node of the MOS transistors VT3 and VT6), and one end of the resistor R3 is connected to the phase-C leg of the three-phase inverter 8. The other ends of the resistors R1-R3 are connected together. Gates of the MOS transistors VT1-VT6 are coupled to respective drive signals PWM1-PWM6, and one end of the resistor R0 is coupled to sources of the MOS transistors VT4-VT6. With this arrangement, when two phases of the BLDC motor 9 are turned on, a phase current will flow through the resistor R0, allowing the detection of a bus current Ibus. In each PWM on-interval, the bus current rises to the same level as the phase current. Therefore, values of the phase current can be determined by sampling the bus current in each PWM on-interval by the current detection circuit 10 and the ADC 2 and are used for current loop regulation in the BLDC motor 9.

In practical applications, fluctuations are often introduced to current loop control by oscillations caused by high-frequency switches for the MOS transistors VT1-VT6 and other components, turn-on delays of some of the MOS transistors VT1-VT6 and other factors. These fluctuations may interfere with the bus current. The sliding average filtering module 60 can utilize a sliding average filtering algorithm to filter sample values of the bus current, thereby mitigating the influence of the aforementioned oscillations on the bus current sample values.

Figure 9:
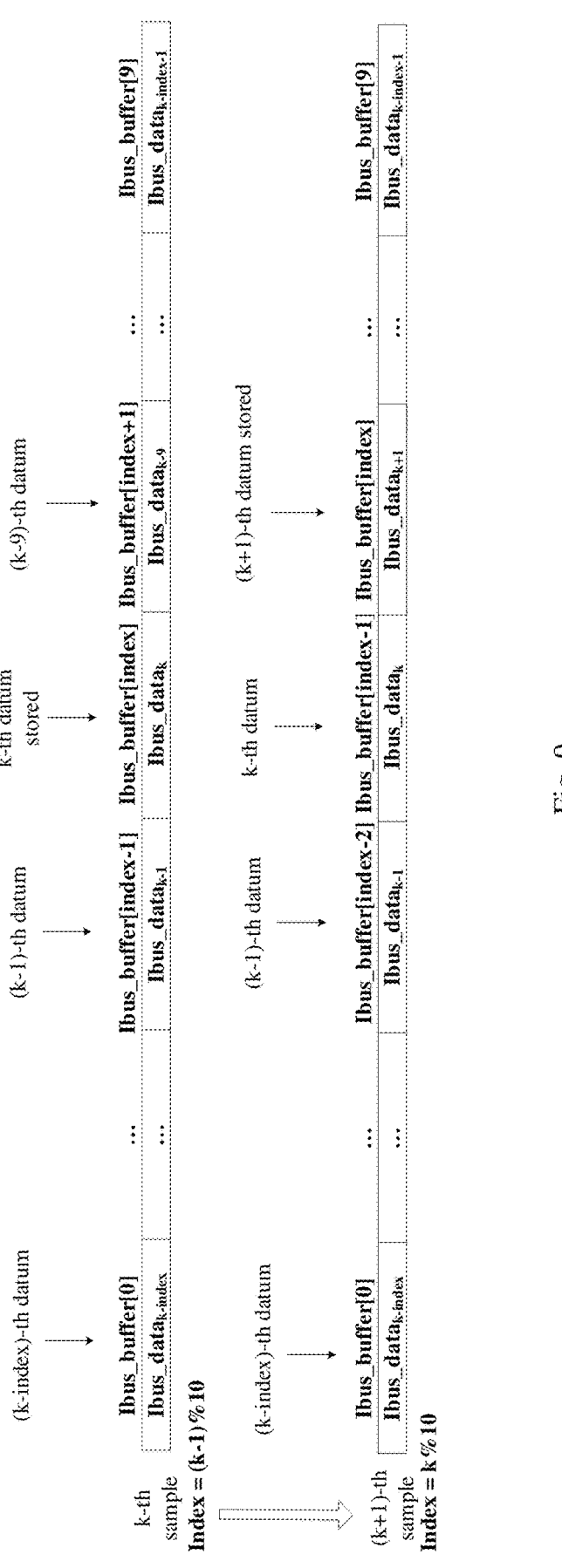
FIG. 9 schematically depicts storage of sample data in a data cache Ibus_buffer in an electronic control system according to an embodiment of the present invention.

As an example, with combined reference to FIGS. 6 and 9, one input channel of the ADC 2 may be configured to sample the bus current in the BLDC motor and perform analog-to-digital conversion on the resulting samples. A bus current array Ibus_buffer [ ] (i.e., Ibus_buffer [0]-Ibus_buffer [n−1]) stored (in the form of a digital sequence) in the data cache 5 may be stored in a circular streaming access mode. Even when Ibus_buffer [ ] becomes full, the configured input channel of the ADC 2 may continue sampling the bus current in the BLDC motor and performing analog-to-digital conversion on the resulting samples. The ADC 2 will store the latest data resulting from such conversion (i.e., bus current sample values) cyclically store in Ibus_buffer [ ] in an FIFO manner, ensuring the latest bus current sample values are always kept in Ibus_buffer [ ]. The sliding average filtering module 60 carries out sliding average filtering on the n data stored in the data cache 5. In this way, sliding average filtering of the bus current in the BLDC motor is achieved.

FIG. 9 shows storage of data resulting from processing of k-th and (k+1)-th sequences by the ADC 2 in Ibus_buffer [

] of the data cache 5 (k≥10 and n=10), where "index" denotes an index of the datum stored at last. As a result of storing the datum resulting from the k-th cycle of sequence processing (i.e., a k-th digital sequence), there are 10 ((k–9)-th to k-th) data in Ibus_buffer [ ]. Moreover, "index"= (k–1)% 10. At this time, an average is calculated by the sliding average filtering module 60 in a k-th calculation as:

$$average\_value_k = \frac{\Sigma_{i=0}^{9} \text{ buffer}(i)}{10}.$$

As a result of storing the datum resulting from the (k+1)-th cycle of sequence processing, the latest datum Ibus_data$_{k+1}$ overrides the earliest datum Ibus_data$_{k-9}$ in the array. That is, the latest datum Ibus_data$_{k+1}$ is stored in Ibus_buffer [index+1], and "index" is incremented by 1 and thus redirected to the latest datum. As such, there are also 10 ((k–8)-th to (k+1)-th) data in Ibus_buffer [ ]. Moreover, "index"=(k–1)% 10. At this point, an average is calculated by the sliding average filtering module 60 in a (k+1)-th calculation as:

$$average\_value_{k+1} = \frac{\Sigma_{i=0}^{9} \text{ buffer}(i) - \text{Ibus\_data}_{k-n+1} + \text{Ibus\_data}_{k+1}}{10}.$$

Therefore, in the electronic control system for the BLDC motor, it is allowed to override the earliest (oldest) datum with the latest datum to ensure that the n data stored in the array of the data cache are always the latest values. Moreover, only a small computational burden is required to handle each new datum for sliding average filtering. Compared with other filtering algorithms, a greater number of average values can be obtained, and a smaller computational burden is required. Each averaging operation simply involves adding a new datum to the previous sum of n data, subtracting the oldest datum from the new sum and dividing the difference by n. In other words, each averaging operation simply involves adding the difference of the currently latest and oldest data divided by n to the previous average.

It should be understood that, in other embodiments of the present invention, the DMA controller and the data cache may be omitted, as required, as shown in FIG. 7. Further, in other embodiments of the present invention, as required, instead of being integrated in the MCU chip, the speed detection circuit 11, the current detection circuit 10 and the three-phase inverter 8 may be also provided as peripheral circuits arranged outside of the MCU chip. This allows the MCU chip to have a reduced chip area.

Referring to FIGS. 6 and 9, layers of software associated with the control system for the BLDC motor in this embodiment include an application layer, a basic software (BSW) layer and a real-time runtime environment. The ADC 2 is configured in a microcontroller abstraction layer of the BSW layer.

In one example, with combined reference to FIGS. 1, 2, 6 and 9, assuming n=10, a sampling method for the ADC 2 may include the steps as follows:

1) Set the size of an array stored in the sequence data register of the ADC 2 (corresponding digital Ibus_buffer [ ] stored in the data cache) to 10.

2) Set a stream enable bit as STREAMEN=1, a stream counter register as STREAMCNT=10 (i.e., a target sequence count), a stream counter auto-reload enable bit as STREAMAREN=1 and a stream interrupt enable bit as STREAMIE=1 in the ADC 2.

3) Transfer bus current sample data by the DMA controller 4 from the sequence data register 24 in the ADC 2 to the data cache 5.

4) Set a time interval at which the timer 7 outputs hardware trigger signals for hardware triggering the ADC 2. Every time the ADC 2 is hardware triggered, its designated channel(s) sample(s) the bus current in the BLDC motor once, and STREAMCNT of the stream counter register is automatically decremented by 1. STREAMCNT can be decremented from 10 to 0 as an actual sequence count kept in the ADC 2 is incremented. When STREAMCNT is decremented to 0, the stream interrupt flag bit STREAMF is set to 1, and the ADC 2 responsively enters a stream interrupt mode. At the same time, STREAMCNT of stream counter register is reloaded with 10.

5) Subject data (i.e., bus current sample values) in the data cache 5 to sliding average filtering by the sliding average filtering module 60 in the period after the ADC 2 is interrupted and before the ADC 2 is again hardware triggered by the timer 7.

Figure 10:
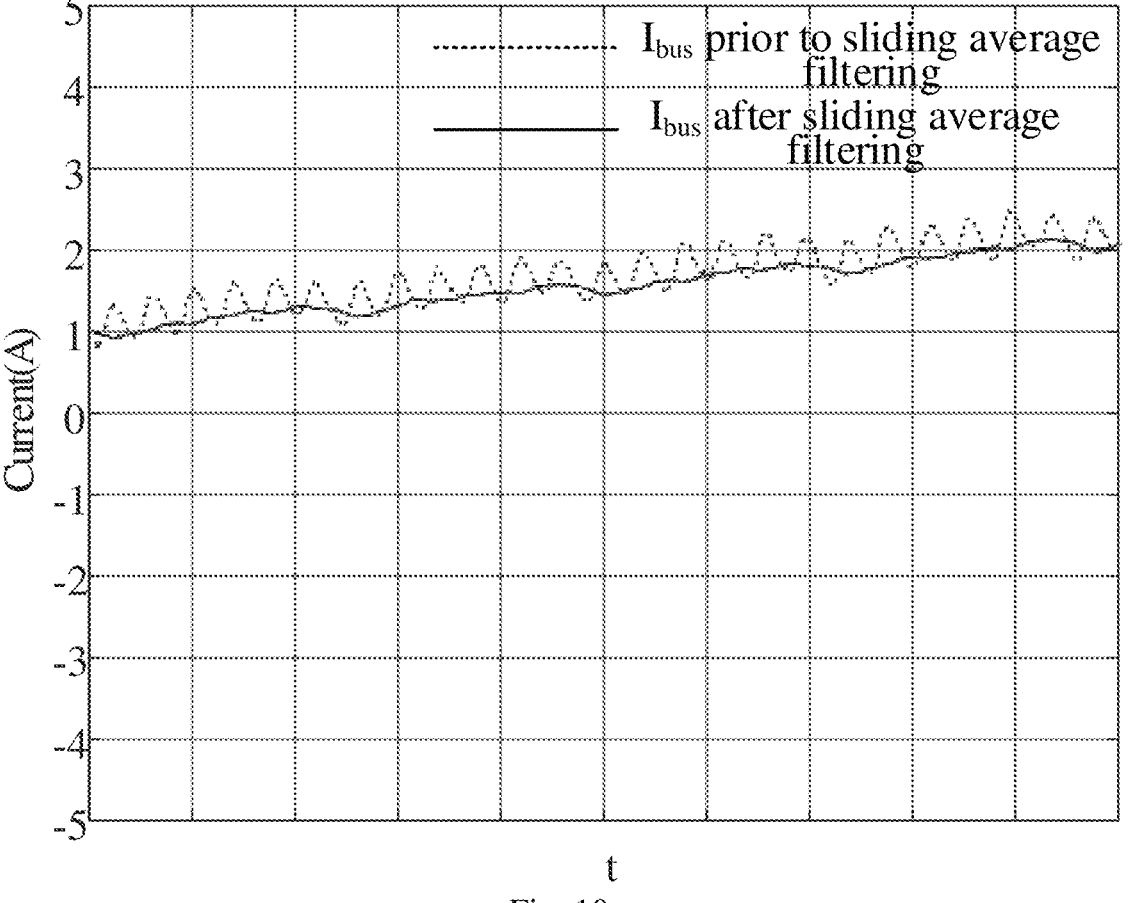
FIG. 10 is a schematic diagram showing a comparison made between bus current profiles of a BLDC motor before and after sliding average filtering is applied in an electronic control system thereof according to an embodiment of the present invention.

Referring to FIG. 10, in this embodiment, adding sliding average filtering and operation of the ADC in the streaming access mode to the BLDC motor and the electronic control system thereof significantly stabilizes the bus current Ibus in the BLDC motor and thus facilitates stable control of the BLDC motor.

It should be understood that, apart from sampling the bus current in the BLDC motor, the present invention is also applicable to sampling a bus voltage, temperature (e.g., a temperature of the MCU chip, a stator of the BLDC motor, a coolant or the like) or another variable of the BLDC motor. After the ADC enters the streaming access mode, a target sequence count is assigned to the streaming access mode, and a stream interrupt signal is generated when an actual sequence count kept in the ADC reaches a target sequence count. Moreover, when the interrupt generation circuit receives the stream interrupt signal and when the latter is valid, it can notify the interrupt controller, which then interrupts the ADC. In this way, the ADC is enabled to operate in the streaming access mode, in which the ADC is interrupted only after it has completed the processing of a preset number of sequences. This overcomes the disadvantages arising from frequent interrupts of the ADC, in particular possible undesirable interrupting of a data processing algorithm running on the MCU core, which may affect real-time control and operation of an electronic system in which the ADC is employed. In particular, in high-frequency applications requiring an ADC to process sequences at a very high speed (especially when a small number of channels are designated for each sequence), the present invention can dispense with the need to interrupt the ADC at the end of processing of each sequence, avoiding untimely interrupt response that may occur due to the generation of a new interrupt during an ongoing interrupt.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. An analog-to-digital converter (ADC), comprising:
a sequence management circuit, which is configured to, after the ADC is triggered and activated, load a target sequence count for a streaming access mode and generate a multi-channel input control signal and a sequence selection output control signal, the sequence management circuit is further configured to generate a stream interrupt signal when an actual sequence count kept in the ADC reaches the target sequence count;

a multi-channel input multiplexer, which is coupled to the sequence management circuit and is configured to receive an analog signal to be converted and, under the control of the multi-channel input control signal, sequentially strobe associated input channel(s) according to a designated conversion priority order designated by each sequence, thereby generating a sample sequence;

an analog-to-digital conversion (ADC) circuit, which is coupled to the multi-channel input multiplexer and is configured to convert the sample sequence into a corresponding digital sequence;

a sequence output multiplexer, which is coupled to the ADC circuit and a sequence data register and is configured to store the digital sequence output from the ADC circuit into the sequence data register according to a specified sequence sorting scheme under the control of the sequence selection output control signal; and an interrupt generation circuit, which is coupled to the sequence management circuit and an associated interrupt controller and is configured to notify the interrupt controller to perform an interrupt processing on the ADC when the stream interrupt signal is valid.

2. The ADC of claim 1, wherein the sequence management circuit comprises:

a streaming access circuit, which is configured to load the target sequence count automatically or by software after the ADC is triggered and activated and to generate the stream interrupt signal when the actual sequence count kept in the ADC reaches the target sequence count;

a sequence sorter, which is configured to, for each sequence, configure the designated conversion priority order designated by each sequence and configure the sequence sorting scheme; and a control signal generation circuit, which is coupled to the streaming access circuit and the sequence sorter and is configured to generate the multi-channel input control signal and the sequence selection output control signal according to the conversion priority order configured by the sequence sorter before the actual sequence count kept in the ADC reaches the target sequence count.

3. The ADC of claim 2, wherein the streaming access circuit comprises:

a stream enable bit, which enables the streaming access mode for the ADC when set valid, or disables the streaming access mode for the ADC when set invalid;

a counting circuit, which is coupled to the stream enable bit and is configured to load the target sequence count during initialization of the ADC in the streaming access mode and to calculate a difference between the actual sequence count kept in the ADC and the target sequence count; and a stream interrupt flag bit, which is coupled to the counting circuit and is configured to be set valid when the difference becomes 0 in the streaming access mode.

4. The ADC of claim 3, wherein the streaming access circuit further comprises:

a comparator, which comprises an input terminal coupled to the counting circuit and an output terminal coupled to the stream interrupt flag bit and is configured to determine whether the difference becomes 0 in the streaming access mode;

a stream interrupt enable bit, which enables an interrupt in the streaming access mode when set valid, or disables an interrupt in the streaming access mode when set invalid; and a stream interrupt generation circuit, which is coupled to the stream interrupt flag bit and the stream interrupt enable bit and is configured to perform a logic AND operation on the stream interrupt enable bit and the stream interrupt flag bit to generate the stream interrupt signal which is valid or invalid.

5. The ADC of claim 3, wherein the counting circuit comprises:

a stream counter register, which is coupled to the stream enable bit and is configured to load the target sequence count during the initialization of the ADC in the streaming access mode; and a counter, which is coupled to the stream counter register and is configured to, in the streaming access mode, decrement the target sequence count stored in the stream counter register by 1 in response to completion of processing of each sequence by the ADC.

6. The ADC of claim 3, wherein the streaming access circuit further comprises a stream counter auto-reload enable bit, which enables the counting circuit to automatically reload the target sequence count when the stream counter auto-reload enable bit is set valid and when the difference becomes 0, or disables the counting circuit from automatically reloading the target sequence count when the stream counter auto-reload enable bit is set invalid and when the difference becomes 0.

7. The ADC of claim 6, wherein the streaming access circuit further comprises a stream counter mode selection bit, which, when set invalid, allows the ADC circuit to continue converting the sample sequence to the digital sequence if the difference becomes 0, or, when set valid, allows the streaming access circuit to automatically reload the target sequence count and allows the ADC circuit to continue converting the sample sequence to the digital sequence upon the difference becoming 0 if the stream counter auto-reload enable bit is also set valid, or prevents the ADC circuit from converting the sample sequence to the digital sequence and causes the target sequence count to be reloaded by the software after the ADC is interrupted according to the set stream interrupt flag bit upon the difference becoming 0 if the stream counter auto-reload enable bit is set invalid.

8. The ADC of claim 1, further comprising a trigger selection circuit, which is coupled to the sequence management circuit and is configured to receive an associated software trigger signal and/or hardware trigger signal and activate operation of the sequence management circuit according to the received software trigger signal and/or hardware trigger signal.

9. The ADC of claim 1, wherein the streaming access mode is a circular streaming access mode, or a linear streaming access mode; in the circular streaming access mode, when the sequence data register becomes full, the sequence output multiplexer stores each subsequent digital sequence into the sequence data register in a first-in first-out (FIFO) fashion; and in the linear streaming access mode, when the actual sequence count reaches the target sequence count, the sequence output multiplexer does not store any new digital sequence into the sequence data register.

10. The ADC of claim 1, wherein during the storage of the digital sequence into the sequence data register according to the specified sequence sorting scheme by the sequence output multiplexer, n digital sequences are kept in the sequence data register, and the sequence output multiplexer overrides the earliest one of the digital sequences in the sequence data register with the digital sequence to ensure that the n digital sequences stored in the sequence data register always constitute the latest combination.

11. A system-on-chip (SoC), comprising the ADC of claim 1.

12. The SoC of claim 11, wherein the SoC is an analog-to-digital conversion (ADC) chip, the ADC chip coupled to a microcontroller unit (MCU) chip disposed outside of the SoC and comprising an interrupt controller, or wherein the SoC is an MCU chip, the MCU chip comprising, integrated on a chip body, an MCU core, an interrupt controller, an input/output (I/O) interface and the ADC, the I/O interface coupled to the ADC and configured to provide an analog signal to the ADC, the MCU core coupled to the ADC and configured to configure signals in the ADC and access and process a digital sequence in the sequence data register of the ADC, the interrupt controller coupled to an output terminal of the ADC and the MCU core and configured to, when receiving a valid interrupt signal output from the ADC, raise an interrupt request to the MCU core, which requires the MCU core to interrupt the ADC.

13. The SoC of claim 12, further comprising a direct memory access (DMA) controller and a data cache, the DMA controller configured to transfer a digital sequence stored in the sequence data register of the ADC to the data cache, wherein the MCU core directly accesses the data cache to process the digital sequence stored in the data cache.

14. The SoC of claim 11, wherein the MCU core comprises a sliding average filtering module, the sliding average filtering module configured to perform a sliding average filtering operation on n data read from the sequence data register of the ADC or from the data cache to calculate an average thereof, where n is the integer greater than 1.

15. The SoC of claim 11, further comprising a timer, which is coupled to the ADC and is configured to generate, at a predetermined time interval, hardware trigger signals for triggering sequence sampling and conversion of the ADC.

16. The SoC of claim 11, wherein the streaming access mode is a circular streaming access mode, or a linear streaming access mode; in the circular streaming access mode, when the sequence data register becomes full, the sequence output multiplexer stores each subsequent digital sequence into the sequence data register in a first-in first-out (FIFO) fashion; and in the linear streaming access mode, when the actual sequence count reaches the target sequence count, the sequence output multiplexer does not store any new digital sequence into the sequence data register.

17. The SoC of claim 11, wherein during the storage of the digital sequence into the sequence data register according to the specified sequence sorting scheme by the sequence output multiplexer, n digital sequences are kept in the sequence data register, and the sequence output multiplexer overrides the earliest one of the digital sequences in the sequence data register with the digital sequence to ensure that the n digital sequences stored in the sequence data register always constitute the latest combination.

18. An electronic control system, comprising the SoC of claim 11.

19. The electronic control system of claim 18, wherein the electronic control system is used to control a brushless direct-current (BLDC) motor, the electronic control system further comprising a three-phase inverter, a speed detection circuit and a current detection circuit, the three-phase inverter coupling the MCU core in the SoC to the BLDC motor, the speed detection circuit coupled to the BLDC motor and configured to detect a rotating speed of the BLDC motor and provide the detected speed to the MCU core, the current detection circuit coupled to the BLDC motor and configured to detect a current in the BLDC motor and provide the detected current to the ADC in the SoC as an analog signal to be converted, wherein the MCU core is based on the detected speed and a digital sequence output from the ADC to drive the three-phase inverter to modify the rotating speed and current of the BLDC motor.

20. The electronic control system of claim 19, wherein the MCU core comprises a sliding average filtering module, a speed loop regulator, a current loop regulator, a pulse-width modulation (PWM) controller, a first superimposer and a second superimposer, the first superimposer coupled to the speed detection circuit and configured to superimpose the detected speed with an associated given speed, the speed loop regulator configured to generate a speed regulation signal based on an output of the first superimposer, the sliding average filtering module configured to generate an average current value based on the digital sequence output from the ADC, the second superimposer coupled to the speed loop regulator and the sliding average filtering module and configured to superimpose the average current value with the speed regulation signal, the current loop regulator configured to generate a regulation signal based on an output of the second superimposer, the PWM controller configured to generate, based on the regulation signal output from the second superimposer, a drive signal for driving operation of the three-phase inverter.

* * * * *